United States Patent

Van Tilburg

[11] Patent Number: 5,845,763
[45] Date of Patent: Dec. 8, 1998

[54] TRANSPORTING DEVICE PROVIDED WITH A DEVICE FOR DETECTING SITUATIONS LEADING TO DAMAGE

[75] Inventor: Tim Van Tilburg, Oosterhout, Netherlands

[73] Assignee: Soltec B.V., Oosterhout, Netherlands

[21] Appl. No.: 696,743

[22] Filed: Aug. 14, 1996

[30] Foreign Application Priority Data

Aug. 18, 1995 [NL] Netherlands ............................ 1001009

[51] Int. Cl.⁶ ............................ B65G 15/14; B65G 43/00
[52] U.S. Cl. .................................... 198/626.6; 198/502.1; 198/817; 198/810.01
[58] Field of Search ................................ 198/626.6, 817, 198/810.01, 810.02, 502.1, 502.3

[56] References Cited

U.S. PATENT DOCUMENTS 4,754,867 7/1988 De Anda .

5,431,273 7/1995 Affeldt et al. ..................... 198/810.02

FOREIGN PATENT DOCUMENTS 8600324 2/1986 Netherlands .

*Primary Examiner*—William E. Terrell
*Assistant Examiner*—Mark Deuble
*Attorney, Agent, or Firm*—Banner & Witcoff, Ltd.

[57] ABSTRACT

A transporting device for transporting substantially flat components between a pair of opposed carrier belts guided along two parallel guide rails which extend in the direction of transport. The flat components are held by clamping elements mounted elastically on the carriers for fixedly clamping the flat components for transport between the carrier belts. Additionally, a detection device for detecting an incorrect position of at least one of the clamping elements in relation to its associated carrier belt is provided which produces a signal that can be used to stop the carrier belts, actuate a warning signal, or for other safety enhancing purposes.

8 Claims, 2 Drawing Sheets

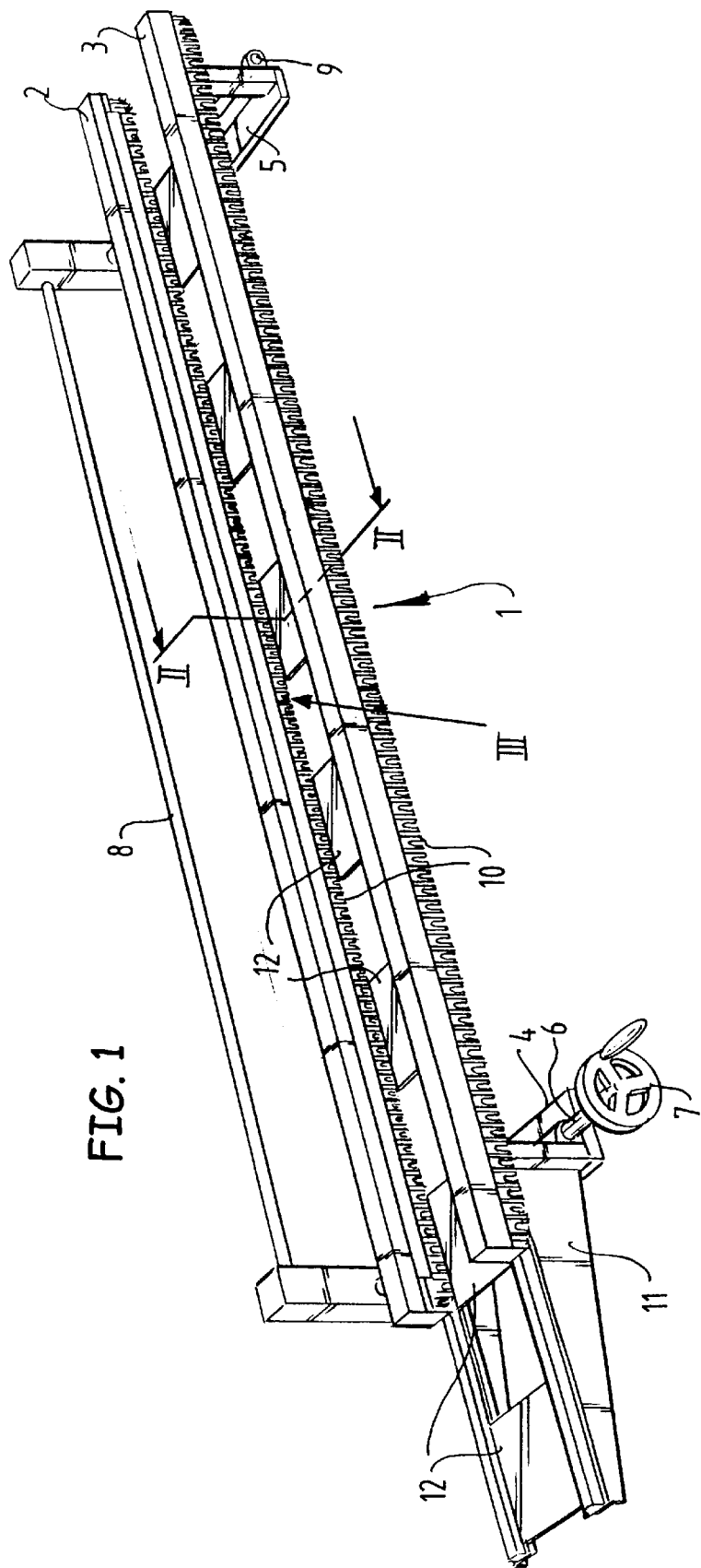

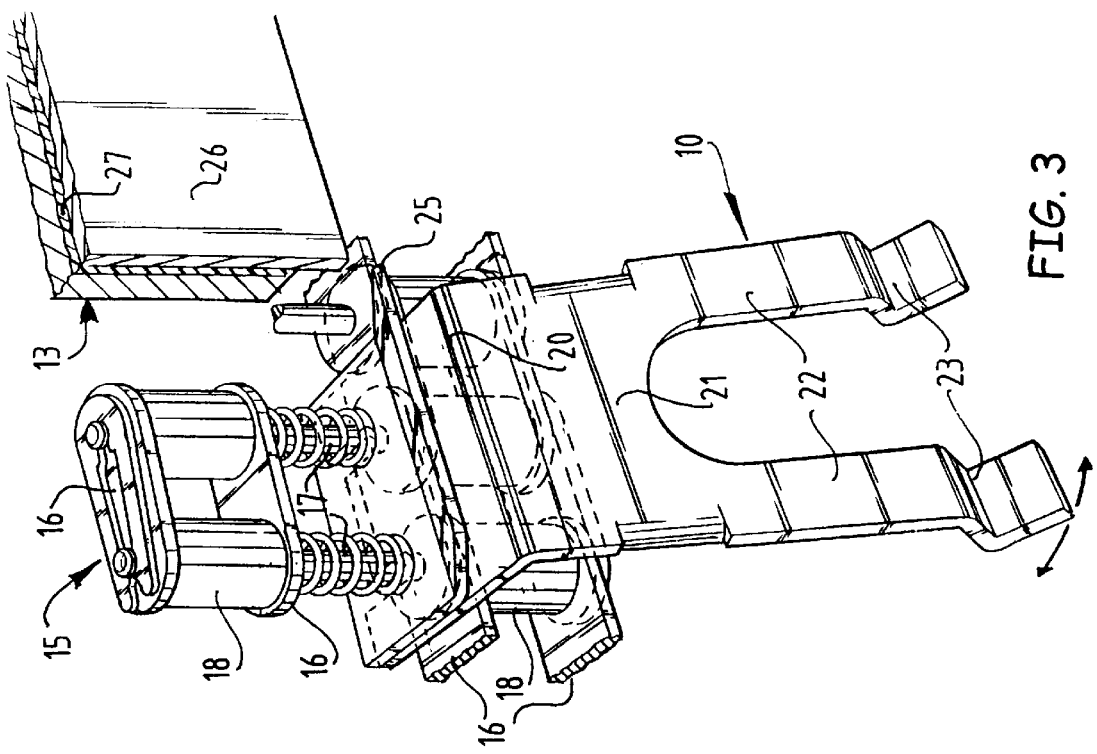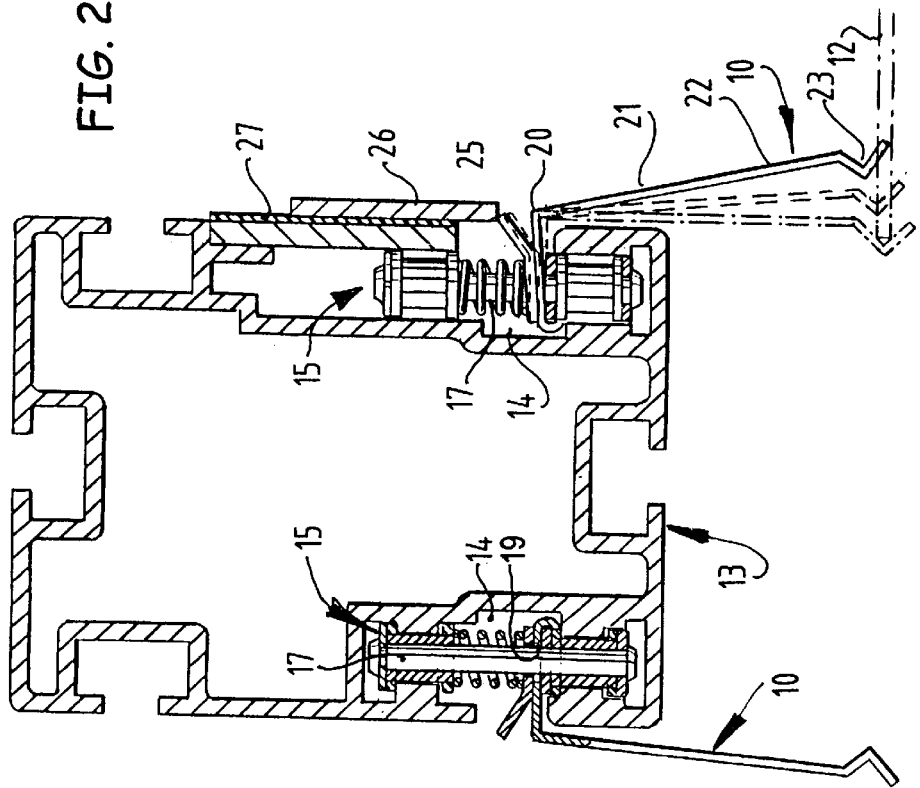

TRANSPORTING DEVICE PROVIDED WITH A DEVICE FOR DETECTING SITUATIONS LEADING TO DAMAGE

The invention relates to a transporting device for transporting substantially flat components, for instance printed circuit boards for subjecting to a soldering treatment, wherein the transporting device comprises:

two guide rails extending mutually parallel in the transporting direction;

carriers guided along each of the guide rails and driven in the transporting direction; and clamping elements mounted elastically on the carriers for fixedly clamping the components for transport.

Such transporting devices, for instance for soldering machines, are generally known, such as for instance from the Netherlands patent application 8600324.

In such transporting devices, which are particularly suitable for transporting printed circuit boards or other types of substantially flat components, the problem occurs that, as a result of an obstacle or when for instance the guide rails do not extend perfectly parallel to each other, there is the danger of the transported components falling out of the clamping elements. When this actually happens considerable damage is caused because, for instance in the case of a soldering machine, the printed circuit boards involved must generally be deemed lost and other printed circuit boards located further on or further back in the production process are usually also lost. Processing thereof is not completed so that they usually become unusable. It can further occur that when printed circuit boards are not supplied wholly correctly they are received askew by the clamping elements and subsequently fall out. Such an incident moreover results in production down-time and thereby to loss of production.

The present invention attempts to obviate the above stated drawback with a detection device for detecting an unusual position of at least one of the clamping elements in relation to the associated carrier.

Practice has shown that falling of a component out of the transporting device is often preceded by the components being present askew or in other incorrect manner in the clamping elements. If such an unusual position can thus be detected, it will be possible to intervene in good time before damage occurs.

Such an askew or otherwise unusual position of the printed circuit boards results in an unusual position of at least one of the clamping elements relative to the associated carrier. The present invention therefore provides a detection device for detecting an unusual position of at least one of the clamping elements relative to the associated carrier.

According to a preferred embodiment the detection device comprises an electrically conducting strip which is arranged in insulated manner relative to the carrier and which is touched by a clamping element situated in an unusual position, in addition to a detection circuit for detecting electrical contact between the conducting strip and the clamping elements each mutually connected for conduction.

This results in an exceptionally simple and thus attractive embodiment of the present invention. The present invention will be elucidated hereinbelow with reference to the annexed drawings, in which:

FIG. 1 shows a schematic perspective view of a transporting device according to the invention;

FIG. 2 shows a cross-sectional view of one of the two guide rails of the transporting device depicted in FIG. 1; and FIG. 3 shows a partly broken away perspective detail view of the transporting device depicted in FIG. 1.

The transporting device 1 shown in FIG. 1 comprises two guide rails 2,3. The guide rails extend mutually parallel. Each of the guide rails 2,3 rests on both supports 4,5. By means of a spindle 6, to which is fixed a handwheel 7, the rail 3 is displaceable in the direction perpendicularly of its longitudinal direction. The parallelism is maintained in that spindle 6 is connected to the second spindle 9 by means of a connecting shaft 8.

Fixed to each of the guide rails 2,3 are gripping elements 10 which, as will be elucidated hereinafter, are driven in longitudinal direction.

Further arranged is a starting belt 11 which is connected to the support 4 for supplying the printed circuit boards 12 for soldering. It is however also possible for a preceding machine to connect onto the transporting device. This is then picked up by the clamping elements 10 and transported along guide rails 2,3.

Such a device is placed integrally above the solder tower. It will be apparent that such a transporting device can be placed above other processing machines. It can even be used purely as transporting device.

As shown in FIG. 2, the guide rails 2,3 are formed by a profile 13. Profile 13 is provided on both sides with a recess 14 in which carriers 15 are movable in longitudinal direction. As shown in FIG. 3, carriers 15 are formed by the links 16 of a chain conveyor which extends integrally in the recess 14 arranged on the one side and through the recess 14 arranged on the other side and thus runs all around. It is herein noted that such a construction is known from the Netherlands patent application 8600324.

The chain links are mutually connected by pins 17, wherein rollers 18 are arranged on the pins 17 between the upper pair of links 16 as well as between the lower pair of links 16.

Such a chain construction could also be described as two separate chains, whereby the pins extend through both chains.

Arranged on the pins between the thus described two chains are clamping elements 10 which are provided with openings 19 through which extend the pins 17. The clamping elements 10 are thus enclosed on pins 17.

Each of the clamping elements is thus formed by a plate 21 folded at a fold 20, wherein the folded portion is divided into two fingers 22. The ends of both fingers 22 are bent so that they comprise hooks 23 for gripping the printed circuit boards for transporting.

Finally, a strip 25 is arranged on the substantially horizontal portion 24 of each of the clamping elements 10. This folded strip extends slightly upward to a position in the vicinity of a contact strip 26 arranged in insulated manner against the side of profile 13. Contact strip 26 is fixed to profile 13 with interposing of an insulating layer 27.

For the operation of the transporting device reference is made once again to the Netherlands patent application 8600324.

The operation of the safety device is such that a potential is applied between contact strip 26 and the chain manufactured from conducting material and formed by the metal links connected by the metal pins 17. This preferably takes place by applying a potential between contact strip 26 and profile 13. A voltage source and a current detector are arranged between these two conducting parts.

When as the result of an unusual position of the clamping elements the strip 25 of the associated clamping element comes into contact with the contact strip 26, the relevant circuit is closed and a current will then begin to flow which is detected by the current detection element. Here can be envisaged a relay or an electronic current detection device. The signal from this current detection device can be used to cause the transport to cease, to give a warning signal and to cause the soldering process to stop. It is of course possible to make a choice of these options or to use the detection signal for other safety-enhancing purposes.

It will be apparent that other electrical solutions are possible for such a detection. It is of course further possible to opt for other mechanical solutions. It is pointed out herein that particularly when a printed circuit board runs up against an obstacle, for instance a lump of solder which has come to lie at an incorrect location, the transport of the printed circuit board is held up whereby it is placed askew between both guide elements and thus between both clamping elements 10. The clamping element 10 will hereby displace on a horizontal axis, for instance parallel to the transporting direction or perpendicularly of the transporting direction. Rotation will in both cases result in contact strip 26 being given a warning signal by strip 25 with the above stated effect.

It will be apparent that the invention can be adapted in diverse ways without deviating from the principle of the invention.

I claim:

1. Transporting device for transporting substantially flat components, comprising:

two guide rails extending mutually parallel in the transporting direction;

carriers guided along each of the guide rails and driven in the transporting direction;

clamping elements mounted elastically on the carriers for fixedly clamping the components for transport, characterized by a detection device for detecting an unusual position of at least one of the clamping elements in relation to the associated carrier where the detection device comprises an electrically conducting strip which is arranged in insulated manner relative to the guide rails and which is touched by a clamping element situated in an unusual position, and a detection circuit for detecting electrical contact between the conducting strip and the clamping elements each mutually connected for conduction.

2. Transporting device as claimed in claim 1, characterized in that each of the clamping elements comprises at least two fingers which are each provided at their bottom with a gripping part and wherein an unusual position comprises at least rotation of the clamping element on a horizontal axis perpendicularly of the transporting direction.

3. Transporting device as claimed in claim 1, characterized in that an unusual position of the clamping element comprises at least rotation of the clamping element on a horizontal axis parallel to the transporting direction.

4. Transporting device as claimed in claim 1, characterized in that the clamping element is connected to the carrier by means of springs allowing rotation on at least two horizontal axes.

5. Transporting device as claimed in claim 4, characterized in that the carriers are each formed by the links of a chain conveyor guided in an aluminium profile.

6. Transporting device as claimed in claim 5, characterized in that each of the links comprises two elements which are connected by pins extending into the links, that each of the clamping elements is provided with at least two openings through which the pins extend, and that a helical spring extending round the pin is arranged between one of the link parts and the clamping element.

7. Transporting device as claimed in claim 6, characterized in that the clamping element is provided with a contact lip.

8. Transporting device as claimed in claim 5, characterized in that the clamping element is provided with a contact lip.

* * * * *